(12) United States Patent
Silva et al.

(10) Patent No.: US 9,070,566 B2
(45) Date of Patent: Jun. 30, 2015

(54) HIGH DENSITY COMPOSITE FOCAL PLANE ARRAY

(71) Applicant: BAE Systems Information and Electronic Systems Integration Inc., Nashua, NH (US)

(72) Inventors: Raymond J. Silva, Saugus, MA (US); Dennis P. Bowler, Sudbury, MA (US); Gene A. Robillard, Stoneham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 40 days.

(21) Appl. No.: 13/766,443

(22) Filed: Feb. 13, 2013

(65) Prior Publication Data

US 2013/0182180 A1 Jul. 18, 2013

Related U.S. Application Data

(62) Division of application No. 12/327,383, filed on Dec. 3, 2008, now Pat. No. 8,400,539.

(60) Provisional application No. 61/193,258, filed on Nov. 12, 2008.

(51) Int. Cl.
*H04N 3/14* (2006.01)
*H04N 5/335* (2011.01)
(Continued)

(52) U.S. Cl.
CPC ............ *H01L 25/065* (2013.01); *H04N 5/2253* (2013.01); *H01L 2924/0002* (2013.01)

(58) Field of Classification Search
CPC .................. H01L 2924/0002; H01L 2924/00; H01L 25/065; H01L 27/108; H01L 27/1225; H01L 29/12; H01L 29/41733; H01L 29/66969; H01L 29/78648; H01L 29/7869; H01L 29/78696

USPC .......... 359/294–324, 274, 275; 257/700, 703, 257/706; 349/294–324, 274, 275, 340, 349/373–375

See application file for complete search history.

(56) References Cited

U.S. PATENT DOCUMENTS

| 4,724,283 | A | | 2/1988 | Shimada et al. | |
| 4,943,491 | A | * | 7/1990 | Norton et al. | 428/620 |

(Continued)

OTHER PUBLICATIONS

"One Piece Compression Interfaces," http://samtec.com/sudden_service/current_literature/z_beam/index.html. (Date: Unknown).

(Continued)

*Primary Examiner* — Joseph P Martinez
*Assistant Examiner* — Brandi Thomas
(74) *Attorney, Agent, or Firm* — Daniel J. Long; Ronald R. Snider

(57) ABSTRACT

A composite focal plane assembly with an expandable architecture has a multi-layer, double-sided aluminum nitride (AlN) substrate and vertical architecture to achieve the dual function of focal plane and electronics backplane. Imaging dice and other electrical components are mounted and wire bonded to one surface and then direct backplane connectivity is provided on the opposing surface through a matrix of electrical contacts. In one embodiment, a flexible connector is sandwiched between the AlN focal plane and a FR-4 backplane is used to compensate for differences in coefficient of thermal expansion (CTE) between the AlN and commercially available high density circuit card connectors that are commonly manufactured from materials with CTE properties more closely approximating FR-4. In an alternate embodiment, the FR-4 and flexible connectors are eliminated by using high density circuit card connectors that are fabricated out of materials more closely matching the CTE of AlN.

4 Claims, 8 Drawing Sheets

(51) Int. Cl.
*H01L 25/065* (2006.01)
*H04N 5/225* (2006.01)

(56) References Cited

U.S. PATENT DOCUMENTS

| | | | |
|---|---|---|---|
| 5,032,896 A | 7/1991 | Little et al. | |
| 5,075,201 A * | 12/1991 | Koh | 430/321 |
| 5,081,563 A | 1/1992 | Feng et al. | |
| 5,241,456 A | 8/1993 | Marcinkiewicz et al. | |
| 5,554,847 A | 9/1996 | Salvio et al. | |
| 5,804,288 A | 9/1998 | Monma | |
| 5,817,406 A | 10/1998 | Cheung et al. | |
| 5,928,769 A | 7/1999 | Monma et al. | |
| 6,040,068 A | 3/2000 | Yasumoto et al. | |
| 6,111,322 A | 8/2000 | Ando et al. | |
| 6,480,014 B1 | 11/2002 | Li et al. | |
| 6,585,527 B2 | 7/2003 | Koopman et al. | |
| 6,590,409 B1 * | 7/2003 | Hsiung et al. | 324/754.22 |
| 6,695,624 B1 | 2/2004 | Szu | |
| 6,734,419 B1 | 5/2004 | Glenn et al. | |
| 6,758,683 B2 | 7/2004 | Koopman et al. | |
| 6,805,561 B1 | 10/2004 | Walkup et al. | |
| 6,824,396 B2 | 11/2004 | Koopman et al. | |
| 7,059,873 B2 | 6/2006 | Johnescu et al. | |
| 7,077,665 B2 | 7/2006 | Kanesashi | |
| 7,094,062 B2 | 8/2006 | Ramey et al. | |
| 7,115,961 B2 * | 10/2006 | Watkins et al. | 257/433 |
| 7,189,080 B2 | 3/2007 | Tang et al. | |
| 7,213,940 B1 | 5/2007 | Van De Ven et al. | |
| 7,223,981 B1 | 5/2007 | Capote et al. | |
| 7,390,195 B2 | 6/2008 | Liao | |
| 7,392,744 B2 * | 7/2008 | Barrois et al. | 101/423 |
| 7,423,821 B2 | 9/2008 | Bechtel et al. | |
| 7,521,692 B2 | 4/2009 | Hatakeyama et al. | |
| 2002/0021786 A1 | 2/2002 | Hamamoto et al. | |
| 2002/0182900 A1 | 12/2002 | Brodsky et al. | |
| 2003/0022555 A1 | 1/2003 | Vicich et al. | |
| 2003/0068920 A1 * | 4/2003 | Li et al. | 439/502 |
| 2003/0203664 A1 | 10/2003 | Koopman et al. | |
| 2004/0192081 A1 | 9/2004 | Koopman et al. | |
| 2005/0277315 A1 | 12/2005 | Mongold et al. | |
| 2005/0287832 A1 | 12/2005 | Mongold et al. | |
| 2005/0287879 A1 | 12/2005 | Mongold et al. | |
| 2006/0186906 A1 | 8/2006 | Bottoms et al. | |
| 2006/0220068 A1 | 10/2006 | Homma | |
| 2006/0255287 A1 | 11/2006 | Cholewa et al. | |
| 2007/0188653 A1 | 8/2007 | Pollock et al. | |
| 2008/0012082 A1 | 1/2008 | Waldman et al. | |
| 2008/0060034 A1 | 3/2008 | Egnal et al. | |
| 2008/0180122 A1 | 7/2008 | Soubh et al. | |
| 2008/0250384 A1 * | 10/2008 | Duffy et al. | 716/21 |

OTHER PUBLICATIONS

"GFZ Series Overview," http://www.samtec.com/technical_specifications/overview.aspx?series=GFZ. (Date: Unknown).

* cited by examiner

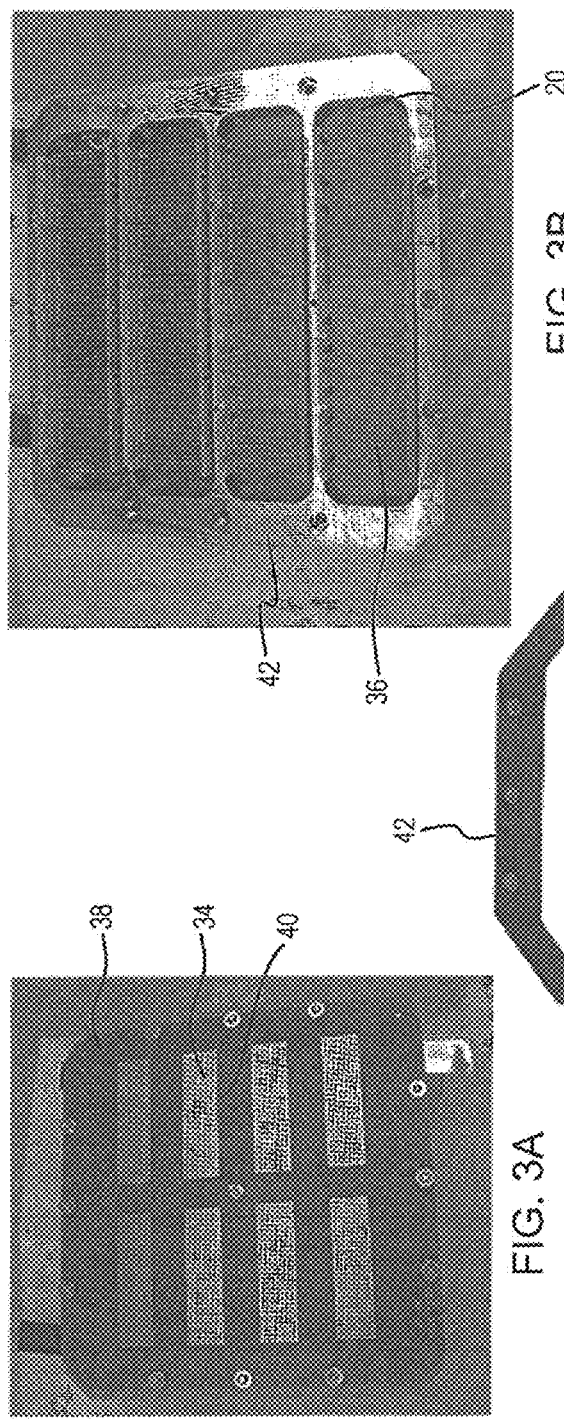

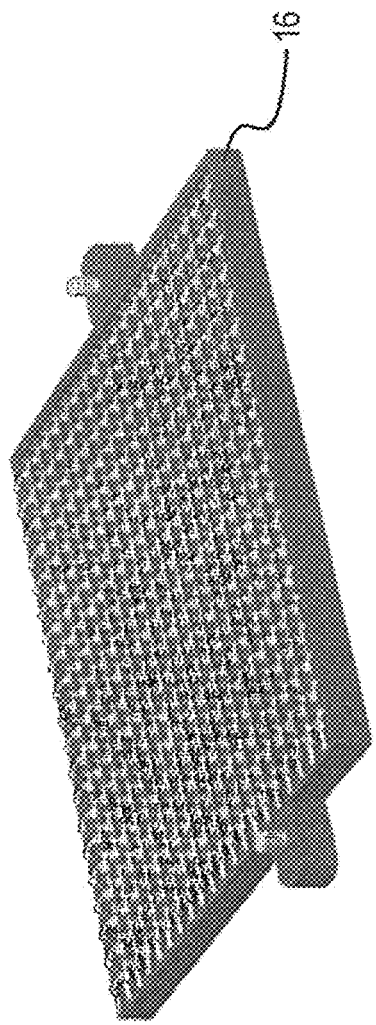

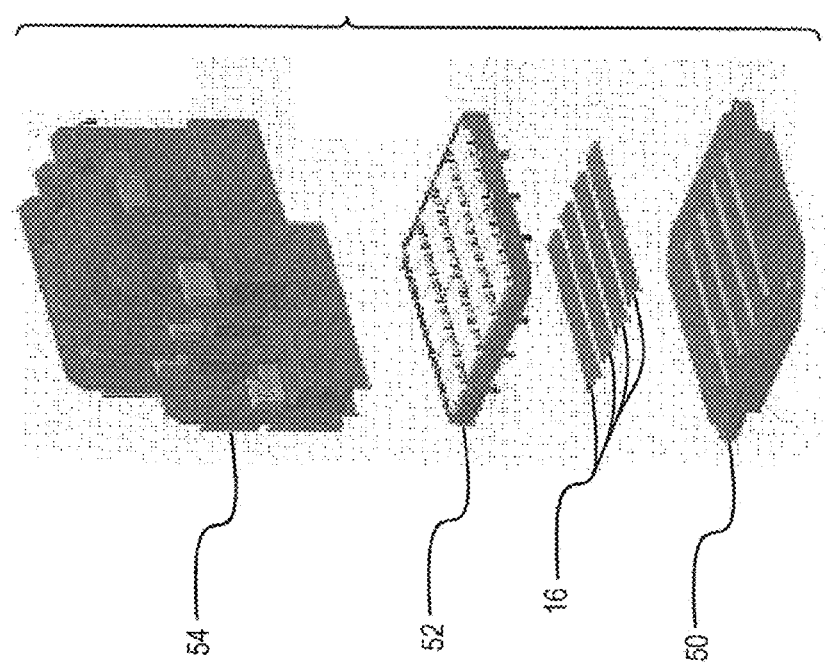

HIGH DENSITY COMPOSITE FOCAL PLANE ARRAY

CROSS-REFERENCE TO RELATED APPLICATIONS

This Application is a divisional of U.S. application Ser. No. 12/327,383, filed Dec. 3, 2008, and claims rights under 35, USC §119(e) from U.S. Application Ser. No. 61/193,258, filed Nov. 12, 2008, the contents of which are incorporated herein by reference.

FEDERALLY SPONSORED RESEARCH

The present invention was made with United States Government support under Contract No. FA8650-07-C-7732. The United States Government has certain rights in the present invention.

1. Technical Field

The present invention relates to a very large format imaging focal plane array with an expandable architecture that can be used to make a gigapixel camera. More particularly, the invention relates to an apparatus that consolidates the functions of a large scale Focal Plane, signal distribution substrate, heat sink and motherboard into a single planar assembly having a vertical architecture wherein the signal leads from hundreds of active, video and passive components mounted on the top surface of the focal plane are routed through a multi layer, thermally conductive, flat and stiff circuit card substrate to the hack surface where the signal lines are formed into a matrix of electrical contacts that can be connected directly or nearly directly to a group of connectors serving as a backplane interface to a set of processing electronics circuit cards.

2. Description of Related Art

Imaging dice are commonly mounted singularly into a device carrier package or sometimes in small groups onto a common substrate. Electrical die connections are then wire bonded to contacts either within the chip carrier or down to the substrate where they are typically routed to the sides of the focal plane assembly away from the active centers of the die to sites along periphery where additional, connections can be made to external circuitry. The external circuits are commonly connected using either flex or wired cables.

However, when the size of the imaging plane board is limited, and a large number of imaging die are required, the prior art construction is pushed beyond its limits in terms of size and the number of connections which is achievable by making connections at the perimeter of the imaging plane board.

It is therefore desirable to provide an optically flat imaging plane board having a small perimeter in proportion to the number of imaging dies placed upon the board.

It is likewise desirable that a large scale focal plane handling tens or hundreds of power consuming dice be thermally conductive in order to dissipate the significant amounts of heat being generated by the devices under power.

SUMMARY

In accordance with one preferred embodiment of the invention, an aluminum nitride (AlN) board is used in a composite focal plane array. The aluminum nitride board can be fabricated into a multi-layer, two sided circuit card assembly, can be post polished to optically flat tolerances, is structurally stiff and is highly thermally conductive which enables it to dissipate large amounts of heat. Also, the coefficient of thermal expansion of the AlN closely matches that of imaging dice which are constructed out of silicon wafers. However, the aluminum nitride board has substantially lower coefficient of thermal expansion (CTE) than conventional FR-4, and similar fiber glass materials used most commonly for commercial circuit card construction. Additionally, manufacturers of high density backplane connectors typically fabricate their products out of Liquid Crystal Polymer (LCP) or similar materials to more closely match the CTE of the FR-4, and other like materials. In this embodiment of the invention, a flexible connector array is connected between the imaging plane board back surface and the motherboard. The flexible connector allows compensation for the difference in the coefficient of thermal expansion. The imaging dies are connected to vias (electrically conducting paths) in the imaging plane board by Tire bond connections. The configuration of the die wire bond connections to the vias in the imaging plane board are around the perimeter of each imaging die. The imaging plane board provides for distribution of signals and via paths through multiple layers of the board, which provide for an array of connections on the backside of the board. A land grid array (LGA) type connector or other flexible connector is then used to connect the imaging plane board to a back plane motherboard. Use of an LGA type connector provides a flexible connector between the FR-4, motherboard and the AlN imaging plane board, which compensates for differences in thermal coefficient expansion.

All features and advantages of the present invention will become apparent in the following written detailed description and claims.

In a second embodiment of the invention 8, an aluminum nitride (AlN) board is used in a composite focal plane array directly without any intermediary FR-4 back plane.

BRIEF DESCRIPTION OF THE DRAWINGS

The invention and a preferred apparatus is shown not to scale. However, the advantages of the invention and further objects thereof will best be understood by the detailed description as well as the drawings.

FIG. 3A shows a silicone carbide support structure which is used to support connectors between the imaging plane board and the back plane motherboard.

FIG. 3B shows the connections on the back plane motherboard.

FIG. 3C shows a stiffening plate which reinforces the FR-4, motherboard and which supports the back plane connectors.

FIG. 4 shows a compression type connector which connects the contact pads of the focal plane board and the contacts of the motherboard.

FIG. 7 shows a complete focal plane assembly with the back plane assembly in a camera.

DETAILED DESCRIPTION OF EMBODIMENTS

Figure 1:
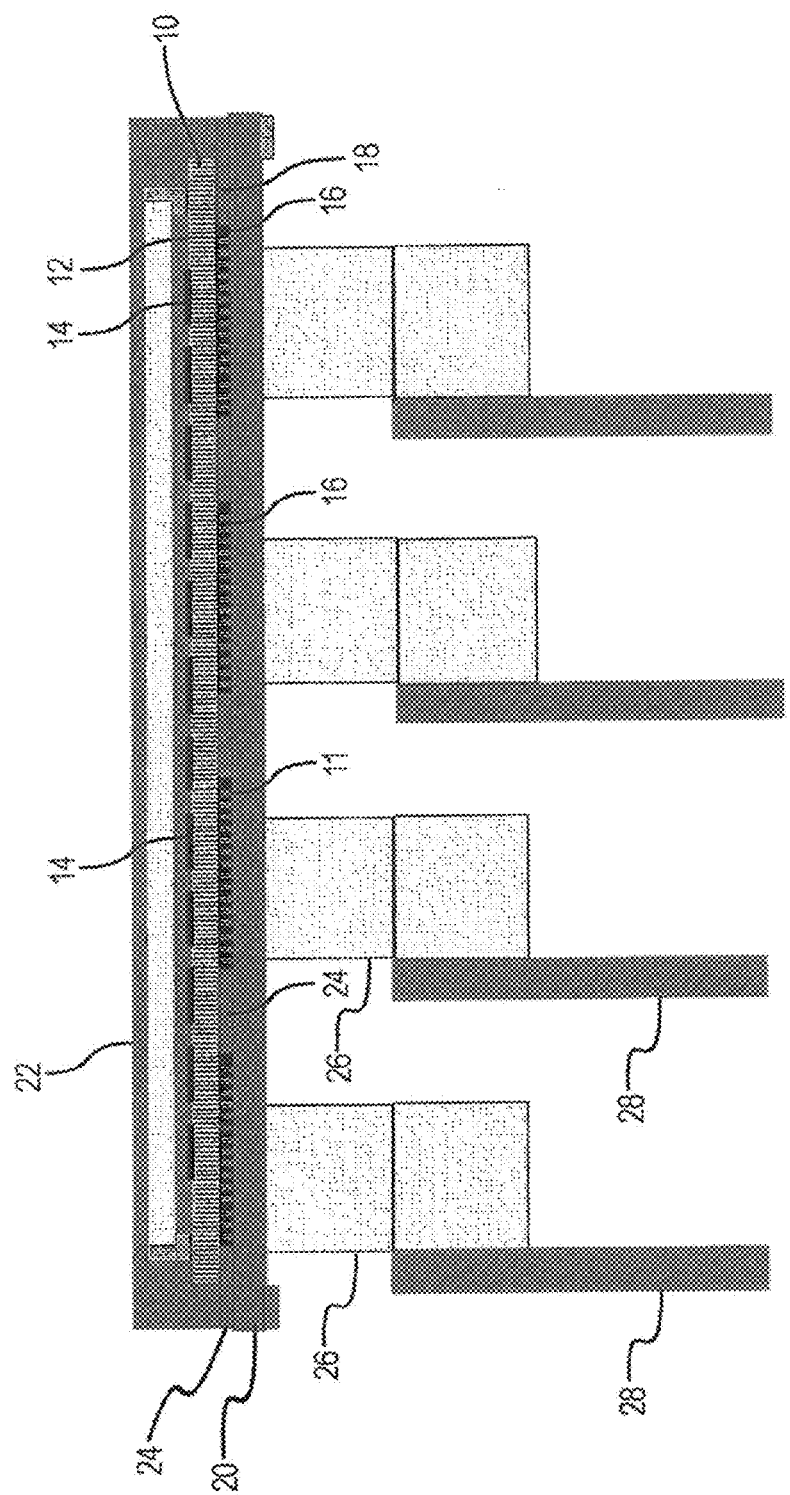
FIG. 1 shows an assembly of the focal plane, the back plane, and the connector of the invention. The drawing is not to scale and illustrates the construction of the preferred embodiment.

FIG. 1 shows a cross-sectional view of a high-density composite focal plane array with the integral back plane board and camera control modules. The optically flat focal plane board 10 is preferably made of layers of aluminum nitride. A large number of imaging dies 14 are placed on the top 12 of the board 10. The number of dies may be enough to comprise a gigapixel camera or a quadrant there-off as in this embodiment. Connectors 16 are placed on the bottom side 18 of the focal plane board 10. The connectors 16 connect a back plane motherboard 20 to the focal plane board 10. On top of the entire assembly is a window 22 made of a material such as sapphire. A silicone plate 24 is placed between the imaging plane board and the motherboard and provides a space, which is used to secure the connectors 16. The connectors 16 are sandwiched between the imaging plane board and the FR-4, motherboard 20. The camera assembly, which utilizes the focal plane array and integral back plane array, is also depicted in FIG. 1. SMT connectors 26 connect the motherboard to camera control modules (processing electronics) 28. It should be noted that FIG. 1 is not to scale, and that configurations of the preferred embodiment are shown in photographs, which are FIGS. 2-7. FIG. 1 shows the components of the assembly conceptually.

The connectors 16 provide for compensation for the difference between the thermal expansion rate of the focal plane board 10 and the motherboard 20. The connectors are preferably spring-loaded connectors of the type used for land grid array chips. Typical LGA connectors provide a spring-loaded contact against pads. Examples of suitable connectors for this invention include those shown in the U.S. Pat. Nos. 6,758, 683; 6,585,527;, and 6,695,624, and Publication Numbers 2006/0186906; 2003/0203664;, and 2004/019208. Further, a connector which may be used with this invention is depicted in FIG. 4. The connector 16 is produced by SAMTEC and is identified as GLZ series. This is a solder-less interconnection type connector. As used in this invention, an example of the connector is an array of connections, which are 40 connections by 10, connections for a total of 400, connections. SAMTEC is located at 520 Park East Boulevard, New Albany, Ind. 47150. The SAMTEC GFZ connectors are land grid array socket assemblies which may also be used for connecting boards, or as test devices for testing chips. This invention, however, is not limited to connectors as produced by SAMTEC. Any connector, which provides for contacts which will provide for compensation for the differences in thermal coefficient expansion between the imaging plane board and the back plane motherboard is suitable for use with this invention.

Figure 5:
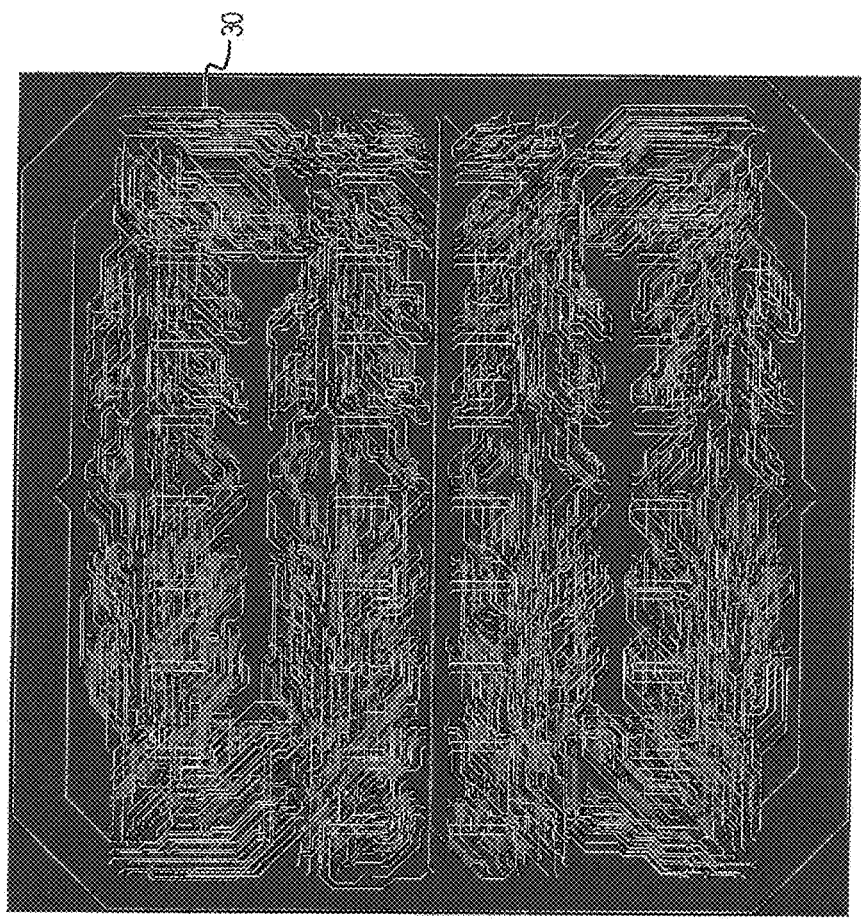
FIG. 5 shows internal layer traces of the focal plane board connection, which route vias between the top layer bond pads connecting the imaging die to the imaging plane board and the array of contacts on the imaging plane board back surface.

The optically flat imaging plane board 10 is preferably an aluminum nitride printed circuit board. The aluminum nitride board can provide an optically flat imaging plane and when constructed with a plurality of layers provides signal lines (vias) (electrical connections) through the thickness of the boards. As shown in FIG. 5, the vias 30 (white lines) overlap each other by passing through layers of the board 10 to allow transition from imaging plane layer bond patterns of the imaging die to an array which matches the flexible connectors 16. The aluminum nitride board is currently available in a size of 4.5"×4.5". With this size board, it is not feasible to provide connections to a motherboard by wire bond connections at the edge of the board 10. The practical limitation is that if the pattern of the imaging die on the surface is squared, than the number if imaging die increases as the square of the number on a side. On the other hand, the number of possible wire bond connections around the perimeter of the imaging plane board only increases linearly. For this reason, if a construction with a large number of dies is required, the number of wire bond connections to be made at an edge of an imaging plane board quickly exceeds feasible limits on the size of the board.

Figure 2A:
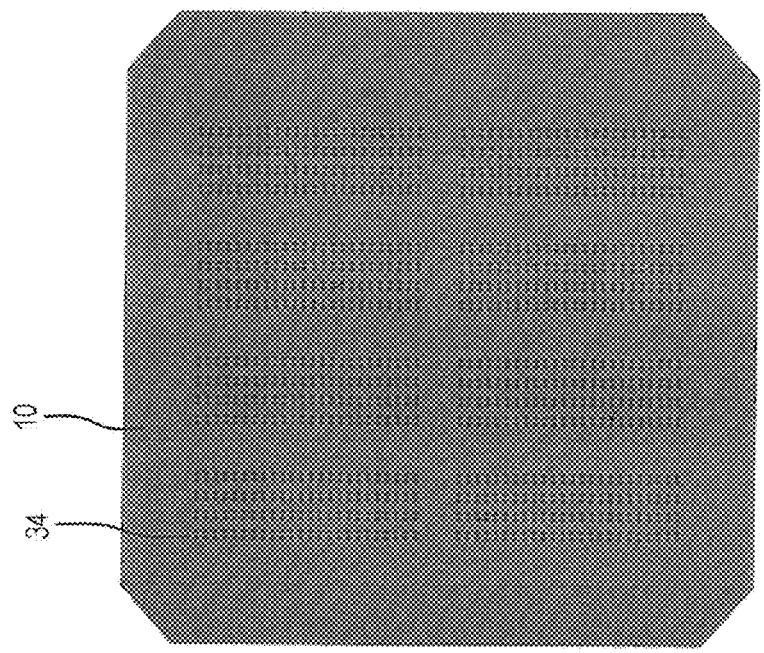
FIG. 2A shows a top view of the focal plane imaging plane board where the imaging dies are mounted. The imaging dies are shown.
Figure 2B:
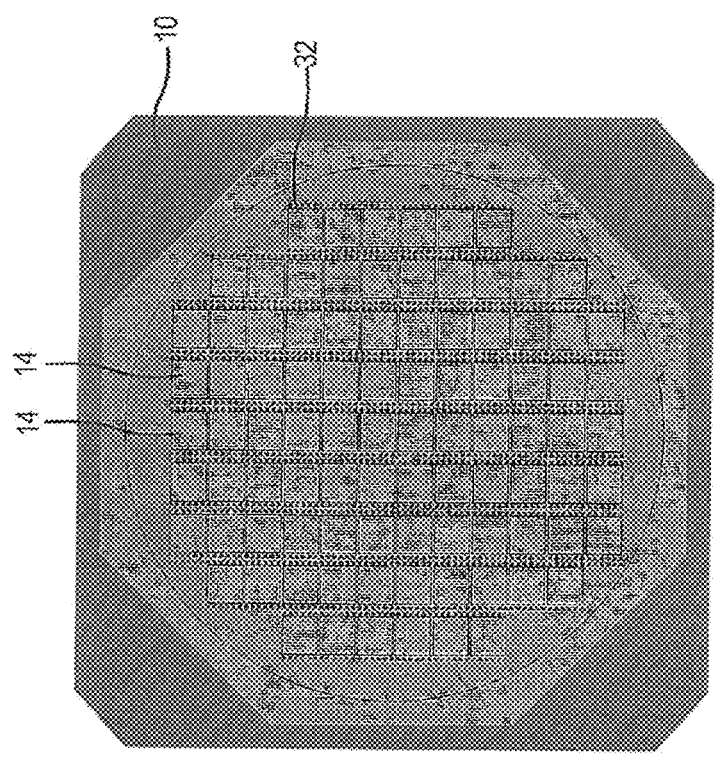
FIG. 2B shows a view of the back surface of the imaging plane board with orderly rows of contact pads.

FIG. 2A shows an array of 92, imaging die placed upon an imaging plane board 10. In this figure, wire bonds 32 which connect the imaging dies 14 to the imaging plane board 10 are shown. It can be easily seen that the large number of required connections may exceed the space is available for wire bond connections around the perimeter of board 10. In this invention, the vias (see FIG. 5) allow rearrangement of the pattern of the wire bond contacts 32 to an array pattern 34 shown in FIG. 2B. FIG. 2B as noted above is the backside of the imaging plane board 10. The array shown in FIG. 2B is, in this example, designed to match an array of a SAMTEC GFC type connector. However, it should be noted that other connectors are suitable with this invention. There may be approximately 5,000, wire bondable pads between the imaging die and the imaging plane board. The bottom of the board 10 may have approximately 1500, pressure contact pads for engaging connector 16. However, the actual number can exceed 3000, allowing for a large number of imaging dies.

The connections 36 to the motherboard 20 are shown in FIG. 3B. The connections 36 engage the connector 16 to provide contact between the motherboard and the imaging plane board. FIG. 3A shows a frame, which holds connectors 38, and a space 40, which receives connectors 16. Also shown in photograph FIG. 3A are the contacts 34 on the back of imaging plane board 10. FIG. 3C shows a stiffening board 42, which is used to reinforce the FR-4, motherboard 20. This stiffener also supports back plane connectors 36 as shown in FIG. 3B.

Figure 6B:
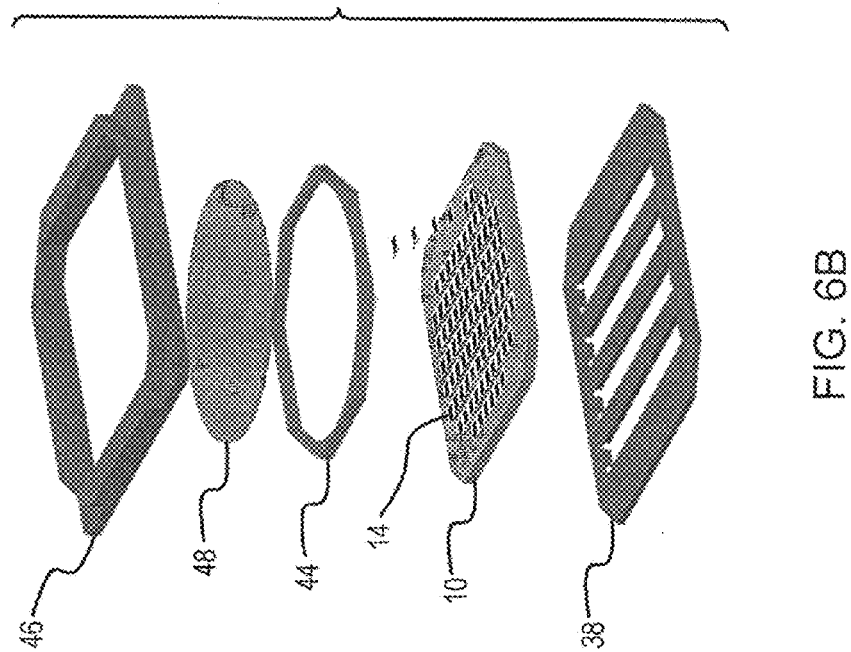
FIG. 6B shows an exploded view of a composite focal plane array assembly.
Figure 6A:
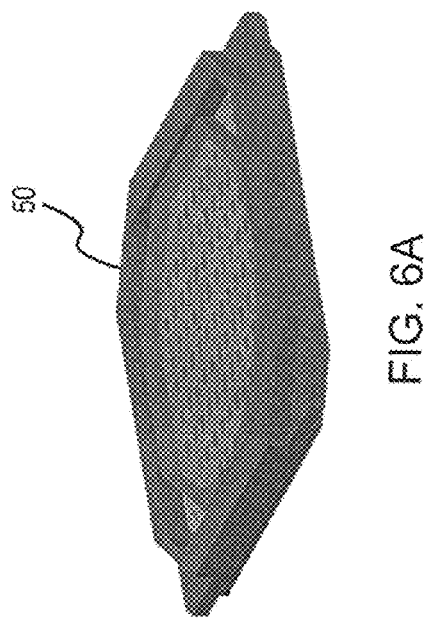
FIG. 6A shows an assembled view of a composite focal plane array assembly.

FIG. 6A shows a completed composite focal plane array assembly 50 and FIG. 6B shows an expanded view of the components of the assembly. The imaging plane hoard 10, the imaging die 14 and the frame 38 previously discussed are shown. In addition, there is shown a bezel 44, which provides separation between the imaging plane board and a sapphire window 48. A support ring 46 is also provided in the completed assembly.

FIG. 7 shows an overall layout of a camera assembly incorporating the composite focal plane assembly 50 depicted in FIG. 6, a plurality of connectors 16, a back plane motherboard 52 with contacts and camera boards 54.

In the second embodiment (FIG. 8) the aluminum nitride board is fabricated into a multi-layer two sided circuit card assembly, which is post polished to optically flat tolerances, is structurally stiff and is highly thermally conductive which enables it to dissipate large amounts of heat. Also, the coefficient of thermal expansion of the AlN closely matches that of imaging dice which are constructed out of silicon wafers. With the use of a backplane connector made from materials of similar CTE to the AlN, including but not limited to AlN itself, a direct single layer apparatus is achieved wherein the processing electronics are plugged directly into the AlN focal plane backplane, eliminating the need for the thermally compensating flexible connector array between the imaging plane board back surface and the motherboard. In this embodiment, the focal plane is the backplane with the imaging die mounted on one surface and the processing electronics plugged directly into connectors mounted on the other surface.

Figure 8:
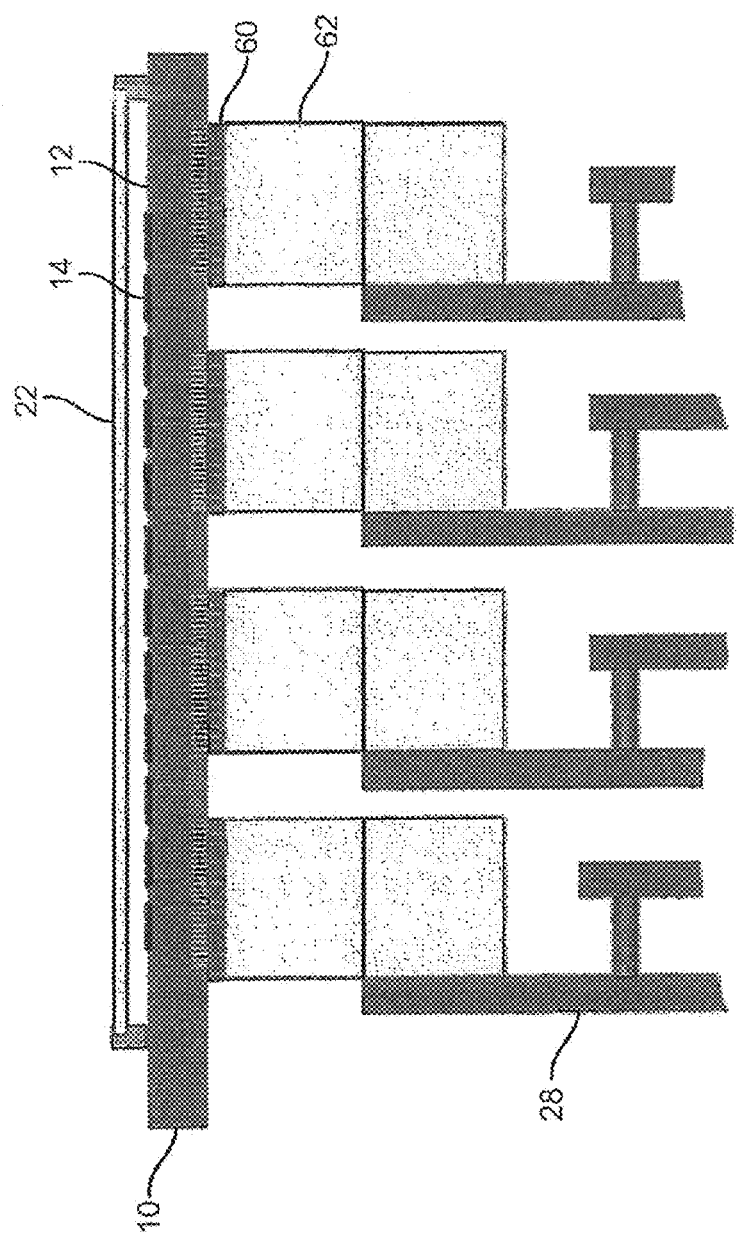
FIG. 8 shows a second embodiment of the invention which combines the functions of the focal plane board and the mother board.

FIG. 8 shows the second embodiment of the invention where the aluminum nitride composite focal plane board 10 combines the functions of the focal plane and the FR-4, mother board of the first embodiment (FIG. 1). In this case, the coefficient of thermal expansion (CTE) of the aluminum nitride board 10 substantially matches the material of the back plane board connectors 60 and 62. This eliminates the need for a thermally compensating connector 16 which is used in the first embodiment (FIG. 1). In the first embodiment, the FR-4, CTE is not closely matched to the aluminum nitride board.

While the application has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A focal plane and back plane assembly comprising:
   an aluminum nitride printed wiring board;
   a plurality of imaging dies mounted on the aluminum nitride printed wiring board;
   a plurality of signal lines routed through the aluminum nitride printed wiring board;
   at least one connector connected to the back of the printed wiring board providing an electrical connection to the signal lines of the aluminum nitride printed wiring board; and
   a back plane motherboard having electrical connections to the connector.

2. The apparatus of claim 1 wherein the plurality of imaging dies are mounted on an image receiving plane of the aluminum nitrite printed wiring board and the connector is mounted on the back opposite to the image receiving plane.

3. The apparatus of claim 1 wherein the motherboard is a FR-4 material.

4. A high-density focal plane assembly having an integral back plane comprising:
   an aluminum nitride printed -wiring board having a plurality of imaging dies on a first surface and signal lines (vias) routed through the aluminum nitride printed wiring board to a second surface of the aluminum nitride printed wiring board;
   a back plane motherboard having electrical contacts;
   a connector sandwiched between the aluminum nitride printed wiring board and the motherboard wherein the connector connects the signal lines of the aluminum nitride printed wiring board to the motherboard electrical contacts.

* * * * *